US007715208B2

(12) United States Patent
Campini et al.

(10) Patent No.: US 7,715,208 B2
(45) Date of Patent: May 11, 2010

(54) CONFIGURABLE MULTI-FACETED INPUT/OUTPUT PANEL

(75) Inventors: Edoardo Campini, Mesa, AZ (US); Javier Leija, Chandler, AZ (US); William Handley, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 914 days.

(21) Appl. No.: 11/530,236

(22) Filed: Sep. 8, 2006

(65) Prior Publication Data

US 2008/0062667 A1   Mar. 13, 2008

(51) Int. Cl.
*H05K 7/00*   (2006.01)
(52) U.S. Cl. .................. 361/796; 361/788; 361/797; 431/131
(58) Field of Classification Search .......... 361/788, 361/796, 797; 439/131, 534
See application file for complete search history.

(56) References Cited

U.S. PATENT DOCUMENTS

| | | | |
|---|---|---|---|
| 5,461,717 A | | 10/1995 | Notarianni et al. |
| 5,639,261 A | * | 6/1997 | Rutkowski et al. .......... 439/534 |
| 5,969,294 A | * | 10/1999 | Eberle et al. .................. 174/57 |
| 6,111,207 A | | 8/2000 | Arterberry et al. |
| 6,144,549 A | * | 11/2000 | Moss et al. ............. 361/679.22 |
| 6,683,390 B2 | * | 1/2004 | Miura ........................ 307/10.2 |
| 7,066,767 B2 | * | 6/2006 | Liao ........................... 439/639 |
| 7,170,753 B2 | * | 1/2007 | Campini .................... 361/737 |
| 7,335,056 B1 | * | 2/2008 | Clark et al. ............. 439/540.1 |
| 7,407,392 B2 | * | 8/2008 | Cooke et al. ................. 439/131 |
| 7,455,548 B2 | * | 11/2008 | Clark et al. ................. 439/534 |
| 7,540,748 B2 | * | 6/2009 | Tracy et al. ................. 439/131 |
| 2005/0078440 A1 | | 4/2005 | Liu |

FOREIGN PATENT DOCUMENTS

WO   2008030700 A1   3/2008

OTHER PUBLICATIONS

International Search Report / Written Opinion Received in PCT Application No. PCT/US2007/076443, mailed Jan. 4, 2008, 10 pgs.
International Preliminary Report on Patentability for PCT Patent Application No. PCT/US2007/076443, Mailed on Mar. 19, 2009, 6 pages.

* cited by examiner

*Primary Examiner*—Dameon E Levi
(74) *Attorney, Agent, or Firm*—Grossman, Tucker, Perreault & Pfleger, PLLC

(57) ABSTRACT

A configurable multi-faceted input/output (I/O) panel may be used in a computer or electronic device to present multiple I/O interfaces to a user. The configurable multi-faceted I/O panels may be configured by a user such that one of a plurality of different I/O faces is accessible to the user. Of course, many alternatives, variations, and modifications are possible without departing from this embodiment.

21 Claims, 4 Drawing Sheets

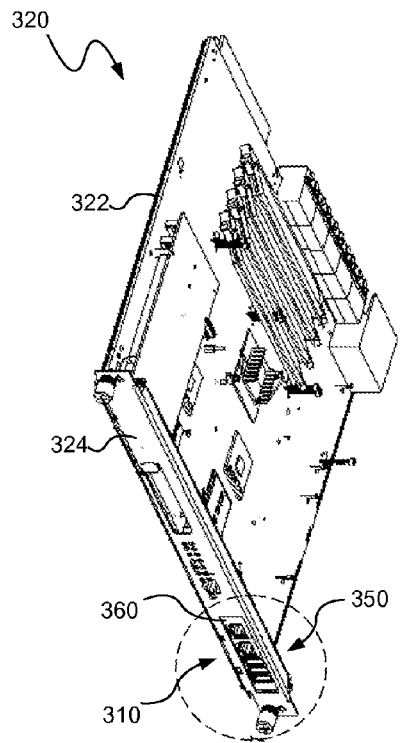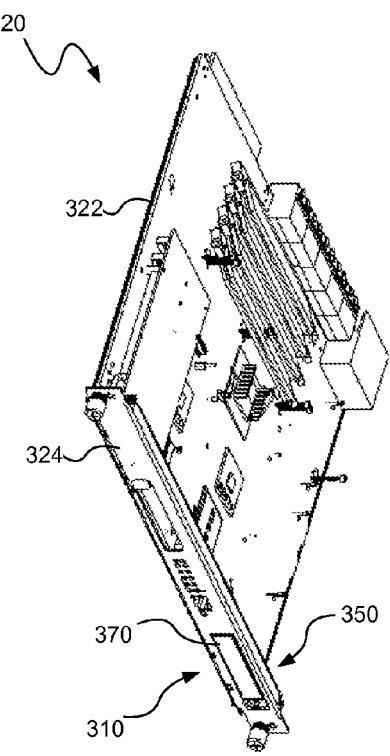
FIG. 3　　　　　　　　　　　　FIG. 4
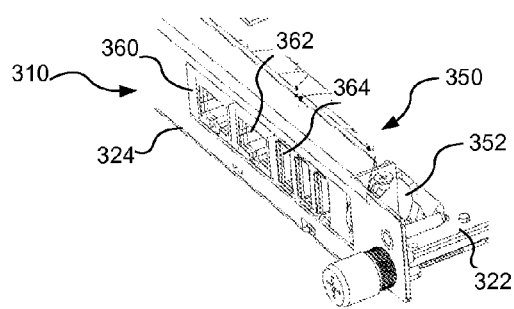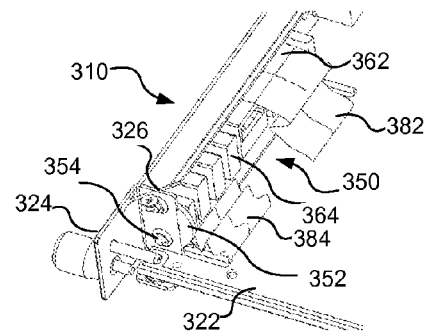
FIG. 5　　　　　　　　　　　　FIG. 6

CONFIGURABLE MULTI-FACETED INPUT/OUTPUT PANEL

FIELD

The present disclosure relates to input/output (I/O) panels in computer and electronic systems, and more particularly, relates to I/O panels on circuit boards in a bladed architecture such as an Advanced Telecommunications Computing Architecture (ATCA).

BACKGROUND

In computers and other electronic systems, input/output (I/O) devices are often used to provide an interface to the computer system. These I/O devices, such as connectors, displays, and LED indicators, may be provided on an I/O panel that is accessible by a user, for example, on an external region of a computer device. In some devices, there may be a need or desire to support different types of I/O interfaces, for example, an I/O interface with connectors and a separate I/O interface with a display and/or LEDs. Supporting different types of I/O interfaces may improve system versatility by allowing one system to support multiple market segments, such as USB, Firewire, Ethernet, and the like. Miniaturization in computer and electronic systems and increases in the number of system components, however, have resulted in limited real estate to support multiple I/O interfaces. For example, in bladed architectures, such as an Advanced Telecommunications Computer Architecture (ATCA) or a CompactPCI (CPCI) system, the real estate is limited on the front panels coupled to the blades in a chassis.

BRIEF DESCRIPTION OF DRAWINGS

Features and advantages of the claimed subject matter will be apparent from the following detailed description of embodiments consistent therewith, which description should be considered with reference to the accompanying drawings, wherein:

FIG. 3 is a perspective view of one embodiment of a circuit board with a configurable multi-faceted I/O panel in a first position;

FIG. 4 is a perspective view of one embodiment of a circuit board with a configurable multi-faceted I/O panel in a second position;

FIG. 5 is a front perspective view of the configurable multi-faceted I/O panel shown in FIG. 3;

FIG. 6 is a rear perspective view of the configurable multi-faceted I/O panel shown in FIG. 3;

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Figure 1:
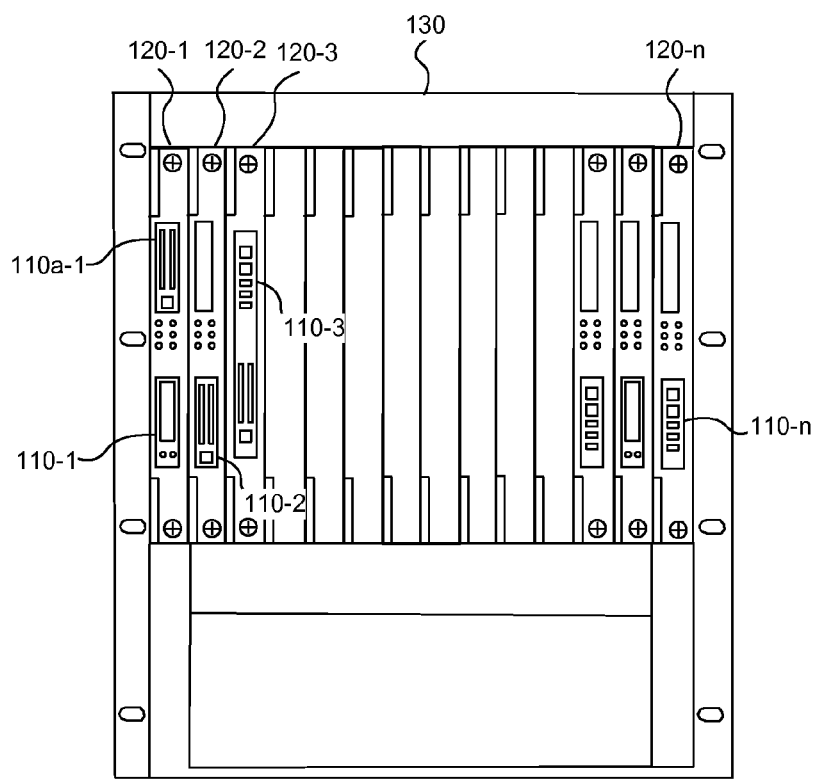
FIG. 1 is a front view of a computer system chassis including circuit boards with configurable input/output (I/O) panels, consistent with one embodiment of the present disclosure.
Figure 2:
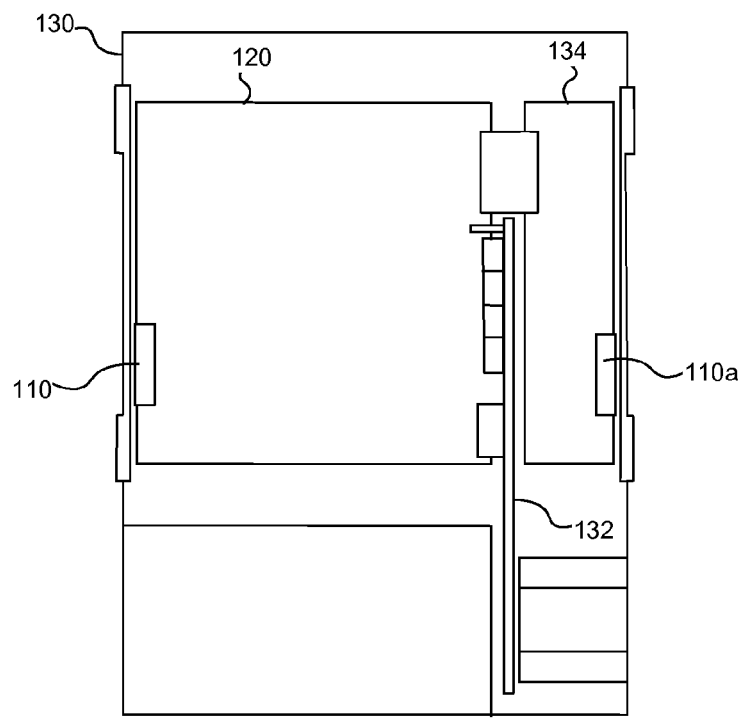
FIG. 2 is a side view of the computer system chassis shown in FIG. 1.

Referring to FIGS. 1 and 2, one or more configurable multi-faceted input/output (I/O) panels 110-1 to 110-n may be used on one or more blades or circuit board assemblies 120-1 to 120-n in a computer system shelf or chassis 130. Any one of the configurable multi-faceted I/O panels 110-1 to 110-n is capable of presenting multiple I/O interfaces to a user. As described in greater detail below, the configurable multi-faceted I/O panels 110-1 to 110-n may be configured by a user to such that one of a plurality of different I/O faces is accessible to the user. As shown, the configurable multi-faceted panels 110-1, 110-2, 110-3, 110-n are configured to present different types of I/O interfaces. The different I/O interfaces may include different connectors and/or visual interface devices such as displays and LEDs.

The circuit board assemblies 120-1 to 120-n may include the same configurable multi-faceted I/O panels or different configurable multi-faceted I/O panels. A circuit board assembly 120-2 may include a single configurable multi-faceted I/O panel 110-2 or a circuit board assembly 120-1 may include multiple configurable multi-faceted I/O panels 110-1, 10a-1. Configurable multi-faceted I/O panels may also have different lengths relative to the circuit board assemblies. Circuit board assembly 120-3, for example, includes a configurable multi-faceted I/O panel 110-3 that is longer than the configurable multi-faceted I/O panel 110-2 on circuit board assembly 120-2.

As shown in FIG. 2, the circuit board assemblies 120 may be coupled to a common backplane 132 within the chassis 130 (only one circuit board assembly 120 is shown in the side view of FIG. 2). The circuit board assemblies 120 may be located within the chassis 130 such that the configurable multi-faceted panels 110 are positioned at an exterior region of the chassis 130 to be accessible to users from outside of the chassis 130. The configurable multi-faceted I/O panel(s) 110 may also be located within the chassis 130 such that the configurable multi-faceted I/O panel(s) 110 are accessible from an inside region of the chassis 130. The chassis 130 may also include one or more rear circuit board assemblies 134 (e.g., rear transition modules) located on a second (or rear) side of the backplane 132 opposite one or more corresponding front circuit board assemblies 120. The rear circuit board assemblies 134 may also include one or more configurable multi-faceted I/O panels 110a.

In some embodiments, the circuit board assemblies 120 may include boards that provide application functionality (e.g., single blade computers, storage blades, network processing and I/O blades) and switch boards that provide switching interconnectivity between the node boards (e.g., fabric switches). The computer system chassis 130 may be an advanced telecommunications computing architecture (Advanced TCA or ATCA) chassis complying with or compatible with, at least in part, PCI Industrial Computer Manufacturers Group (PICMG), Advanced Telecommunications Computing Architecture (ATCA) Base Specification, PICMG 3.0 Rev. 2.0, published Mar. 18, 2005, and/or later versions of the specification ("the ATCA specification"). According to such an embodiment, the circuit board assemblies 120 may be ATCA blades complying with or compatible with, at least in part, the ATCA Specification.

Various other embodiments consistent with the present disclosure may include a chassis and/or circuit boards complying with and/or compatible with technical specifications other than and/or in addition to the ATCA Specification. A configurable multi-faceted I/O panel may also be used, for example, in other types of bladed architectures including, but not limited to, VME, CompactPCI (CPCI), and IBM Blade-Center®. A configurable multi-faceted I/O panel may also be used on other computer or electronic devices that use multiple types of I/O interfaces including, but not limited to, notebook computers, desktop computers, home entertainment products, mobile products (e.g., PDAs, cell phones, MP3 players, DVD/CD players, etc.) and automotive entertainment and communication products. The scope of the present disclosure should not, therefore, be construed as being limited to any particular computer system, device, or form factor.

Referring to FIGS. 3-6, one embodiment of a configurable multi-faceted I/O panel 310 on a circuit board assembly 320 is shown in greater detail. The circuit board assembly 320 may include a circuit board 322 and a face plate 324 mounted to the circuit board 322. The configurable multi-faceted I/O panel 310 may include an I/O device positioning mechanism 350 positioned in an open I/O access region defined by the face plate 324. The I/O device positioning mechanism 350 may include at least two I/O faces 360, 370 that may be selectively positioned within the open region defined by the face plate 324. FIG. 3 shows the I/O device positioning mechanism 350 positioned in one position such that the I/O face 360 appears in the open region of the face plate 324 and is accessible by the user. FIG. 4 shows the I/O device positioning mechanism 350 positioned in another position such that the I/O face 370 appears in the open region of the face plate 324 and is accessible by the user.

In one embodiment, the circuit board 322 and face plate 324 may comply with or be compatible with, at least in part, the ATCA specification. In one example, the face plate 324 may be sized with a length to accommodate a circuit board 322 having a size in a range of about 8U (~355.6 mm)×280 mm. The face plate 324 may also be sized such that the circuit board assembly 320 may be coupled to a backplane in a chassis (e.g., chassis 130 in FIG. 1) with a pitch in the range of about 6 HP (about 30.48 mm or 1.2 in.). In other embodiments, the circuit board 322 and face plate 324 may comply with other form factors.

The I/O device positioning mechanism 350 may include a user selection member 352 that allows the user to select a desired position of the I/O device positioning mechanism 350. In one embodiment, the I/O device positioning mechanism 350 may be pivotably or rotatably mounted relative to the face plate 324, and the user selection member 352 may be a thumbwheel or other device that allows the user to rotate the I/O device positioning mechanism 350. As shown in FIG. 6, for example, the I/O device positioning mechanism 350 may include a pivot member 354 that pivotably engages a bracket 326. The bracket 326 may extend from the face plate 324 or may be a separate piece that is mounted to the circuit board 322. A similar pivot member (not shown) may extend from the opposite side of the I/O device positioning mechanism 350 to engage a similar bracket (not shown).

Figure 7:
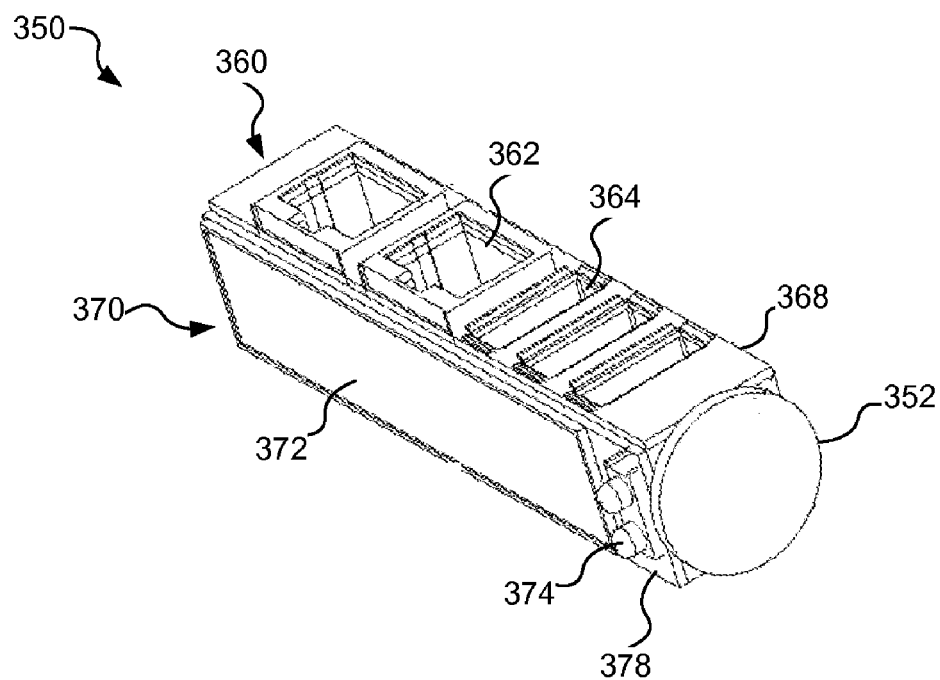
FIG. 7 is a front perspective view of an I/O device positioning mechanism, consistent with one embodiment of the present disclosure.
Figure 8:
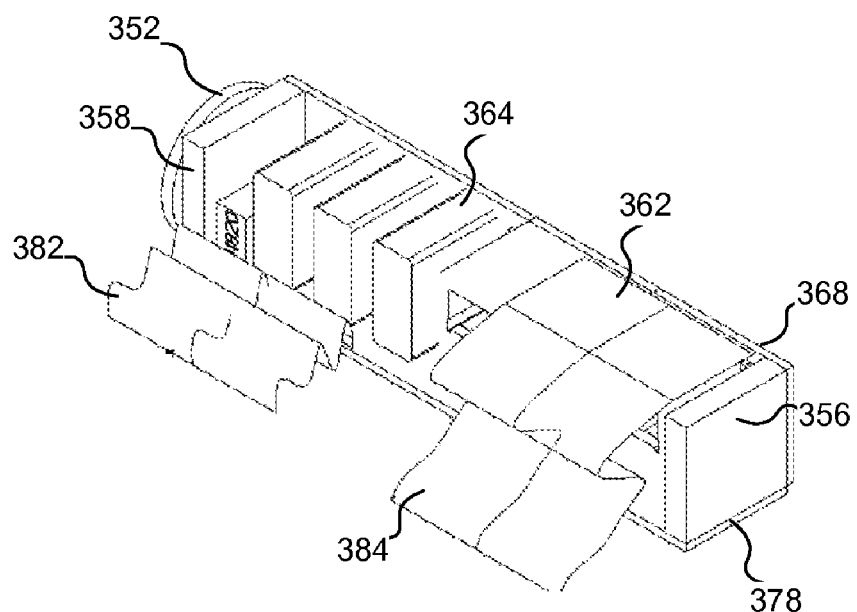
FIG. 8 is a rear perspective view of the I/O device positioning mechanism shown in FIG. 7.

FIGS. 7 and 8 show one embodiment of the I/O device positioning mechanism 350 in greater detail. The I/O device positioning mechanism 350 includes I/O devices 362, 364, 372, 374 mounted such that one or more I/O devices 362, 364 are accessible from the I/O face 360 and one or more I/O devices 372, 374 are accessible from the I/O face 370. In the exemplary embodiment, the I/O devices 362, 364 accessible from the I/O face 360 are connectors and the I/O devices 372, 374 accessible from the I/O face 370 are visual interface devices such as a display 372 and LEDs 374. Thus, the user may access the I/O connectors 362, 364 when the config-urable multi-faceted I/O panel 310 is positioned as shown in FIG. 3, and the user may access the visual interface devices 372, 374 when the configurable multi-faceted I/O panel 310 is positioned as shown in FIG. 4.

The illustrated embodiment of the I/O device positioning mechanism 350 includes an I/O device support member that may be formed by plates 368, 378 supporting the I/O devices 362, 364, 372, 374 to provide the I/O faces 360, 370. As shown, the connector I/O devices 362, 364 may be mounted to the plate 368 and the display I/O device 372 and LED I/O devices 374 may be mounted to the plate 378. The configurable I/O mechanism 350 may also include end portions 356, 358 coupled to ends of the plates 368, 378. A user selection member 352 (e.g., a thumbwheel) may be coupled to one or both of the end portions 356, 358. The end portions 356, 358 may also support pivot members for pivotably mounting the configurable I/O mechanism 350, as described above. The plates 368, 378, end portions 356, 358 and user selection member 352 may be made of any suitable materials, e.g., PCB materials, metal or plastic, known to those skilled in the art. The I/O devices 362, 364, 372, 374 may be mounted to the plates 368, 378 and/or end portions 356, 358 using any technique known to those skilled in the art.

Examples of connector I/O devices include, but are not limited to, Ethernet connectors, Universal Serial Bus (USB) connectors, Firewire or IEEE 1394 connectors, Small Computer System Interface (SCSI) connectors, PS/2 port connectors, serial port connectors, optical connectors, audio connectors (e.g., channel out, line in, microphone), video connectors (e.g., DVI and S-Video), coaxial connectors, and media card reader connectors (e.g., a CompactFlash® card reader connector). Examples of visual interface devices include displays (e.g., LCD or LED displays) and LED indicators. Other I/O devices may include, but are not limited to, switches, user input keys or buttons (e.g., power or reset buttons), and other user control or input devices.

Different combinations of I/O devices form different I/O interfaces. Although the exemplary embodiment shows one I/O face 360 with all connectors 362, 364 and another I/O face 370 with all visual interface devices 372, 374, various combinations of connectors, visual interface devices, and/or other I/O devices may be used to form different I/O interfaces.

The I/O devices 362, 364, 372, 374 of the configurable multi-faceted I/O panel 310 may be coupled to one or more interconnects 382, 384 that are capable of allowing the configurable multi-faceted I/O panel 310 to move between different positions while maintaining the connection. The interconnects 382, 384 may couple the I/O devices 362, 364, 372, 374 to signal paths and/or conductive paths in the circuit board 322 or directly to electronic components mounted on the circuit board 322. In the exemplary embodiment, the interconnects 382, 384 used to couple the connector I/O devices 362, 364 are flexible film circuits. The flexible film circuits 382, 384 may include a dielectric substrate (e.g., polyimide or epoxy) and conductors (e.g., copper) through the dielectric substrate. One example of a flexible film circuit that may be used is the type available from 3M Corporation. The conductors in the flexible film circuits 382, 384 may be connected to paths in the circuit board 322, for example, through vias or pads extending into the circuit board 322. The I/O devices may also be coupled using other types of interconnects including, but not limited to, discrete wires, ribbon cables, coaxial cables, optical fibers, compression type connectors, mechanical interface connectors, and vertical-cavity surface-emitting lasers (VCSELs).

Although the configurable multi-faceted I/O panel 310 is shown in the exemplary embodiment as only a section of the face plate 324, the I/O panel 310 may extend the entire length of the face plate. Multiple configurable multi-faceted I/O panels (not shown) may also be provided along a single face plate 324. A configurable multi-faceted I/O panel also may be coupled to other structures (e.g., to a computer system chassis) instead of to a circuit board.

The illustrated embodiments show the configurable multi-faceted I/O panel 310 with two possible I/O faces 360, 370 configurable into two possible positions. This embodiment is capable of providing twice the effective I/O panel space, for example, in a standard ATCA blade. The configurable multi-faceted I/O panel 310 may also include additional faces and positions to increase further the number of possible I/O interfaces that may be selected and accessed by a user. The I/O device positioning mechanism 350, for example, may include three or four sides or plates to provide three or four respective I/O faces. Other numbers of sides and I/O faces are also possible. Although the I/O faces are shown as flat sides in the exemplary embodiments, a configurable multi-faceted I/O panel may also include rounded faces. The I/O device positioning mechanism, for example, may be cylindrical or semi-cylindrical with different rounded portions providing different I/O faces.

Figure 9:
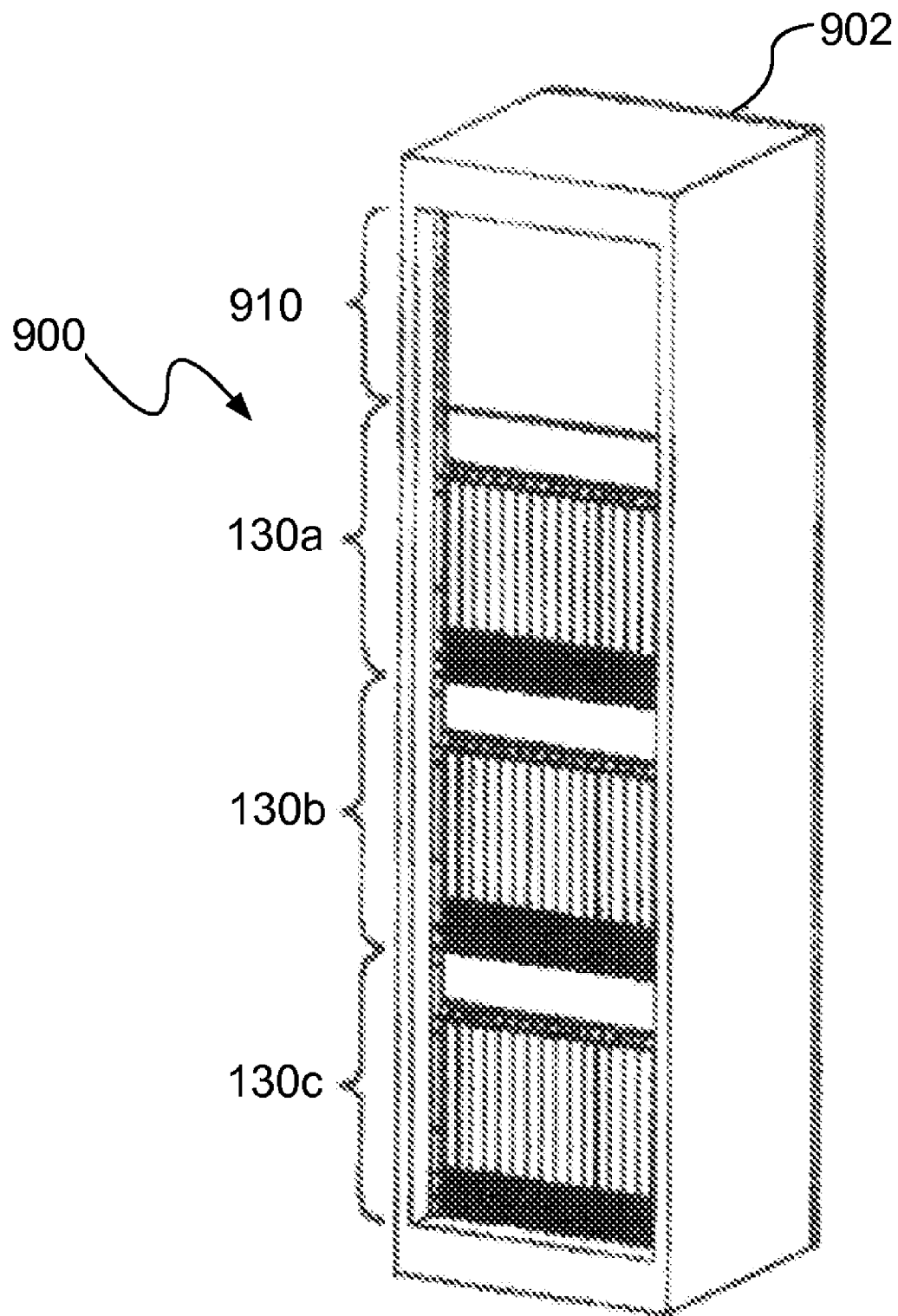
FIG. 9 is a perspective view of a system including a cabinet and a plurality of chassis, consistent with another embodiment of the present disclosure.

Referring to FIG. 9, a system 900 may include a frame or cabinet 902 that accommodates and electrically couples a plurality of shelves or chassis 130a, 130b, 130c similar to the chassis 130 shown in FIG. 1. According to one example, a cabinet 902 may be provided by a telecommunications equipment manufacturer (TEM) to house telecommunications equipment. One or more of the chassis 130a, 130b, 130c may include circuit boards with configurable multi-faceted I/O panels consistent with any embodiment described herein. The cabinet 902 may include, for example, a power supply for providing power to each of the individual chassis 130a, 130b, 130c and other equipment 910 (e.g., alarms, power distribution units, etc.) disposed in the cabinet 902. Additionally, as mentioned above, the cabinet 902 may electrically couple one or more of the chassis 130a, 130b, 130c to at least one other chassis.

According to an alternative embodiment, rather than being disposed in a common cabinet, a system consistent with the present disclosure may include a plurality of chassis that may be individually hardwired to one another without a cabinet. One or more of the plurality of chassis may include circuit boards with configurable multi-faceted I/O panels consistent with any embodiment described herein. Additionally, each of the plurality of chassis may be powered by an individual power supply and/or may be separately powered by a common power supply. Such a system may, therefore, provide a greater freedom in the physical arrangement and interrelation of the plurality of chassis.

Consistent with one embodiment, an apparatus may include a circuit board and at least one configurable multi-faceted input/output (I/O) panel coupled to the circuit board. The configurable multi-faceted I/O panel includes at least first and second I/O faces. The first I/O face provides access to at least a first I/O device and the second I/O face provides access to at least a second I/O device. The multi-faceted I/O panel is configured to be positioned between at least first and second positions such that the first I/O face is accessible in the first position and the second I/O face is accessible in the second position.

Consistent with another embodiment, an apparatus may include an input/output (I/O) support member providing at least first and second I/O faces, at least first and second I/O devices supported on the I/O support member such that the first I/O device is accessible via the first I/O face and the second I/O device is accessible via the second I/O face, and at least one user selection member coupled to the I/O support member to position the I/O support member between at least first and second positions enabling access to the first and second I/O faces, respectively.

Consistent with a further embodiment, a system may include a cabinet including a plurality of computer system chassis including a plurality of blades. At least one of the blades comprises a circuit board and at least one configurable multi-faceted input/output (I/O) panel coupled to the circuit board. The configurable multi-faceted I/O panel includes at least first and second I/O faces. The first I/O face provides access to at least a first I/O device and the second I/O face provides access to at least a second I/O device. The configurable multi-faceted I/O panel is configured to be positioned between at least first and second positions such that the first I/O face is accessible in the first position and the second I/O face is accessible in the second position.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. An apparatus comprising:
a circuit board; and
at least one configurable multi-faceted input/output (I/O) panel coupled to the circuit board, the configurable multi-faceted I/O panel including at least first and second I/O faces, the first I/O face providing access to at least a first I/O device and the second I/O face providing access to at least a second I/O device, and wherein the multi-faceted I/O panel is configured to be positioned between at least first and second positions such that the first I/O face is accessible in the first position and the second I/O face is accessible in the second position, wherein the first and second I/O devices include at least one I/O connector and at least one visual interface device.

2. The apparatus of claim 1 further comprising interconnects coupled to the first and second I/O devices such that the I/O devices are able to move between the first and second positions while remaining coupled.

3. The apparatus of claim 1 further comprising electronic components mounted on the circuit board and flexible film circuits coupled between the first and second I/O devices and the circuit board, and wherein the flexible film circuits electrically couple the electronic components to the I/O devices.

4. The apparatus of claim 1 wherein the at least a first I/O device includes at least one connector accessible from the first I/O face, and wherein the at least a second I/O device includes at least one visual interface device accessible from the second I/O face.

5. The apparatus of claim 1 wherein the configurable multi-faceted I/O panel includes a face plate defining an I/O access region and an I/O device positioning mechanism aligned with the access region of the face plate.

6. The apparatus of claim 5 wherein the I/O device positioning mechanism is rotatably mounted relative to the circuit board and faceplate such that the first and second I/O faces are selectable by rotating the I/O device positioning mechanism.

7. The apparatus of claim 6 wherein the I/O device positioning mechanism includes a user selection member configured to allow a user to rotate the I/O device positioning mechanism.

8. The apparatus of claim 1 wherein the circuit board and the face plate are part of an ATCA blade.

9. The apparatus of claim 1 wherein the face plate is sized to provide a pitch of 6 HP when the circuit board is coupled in a chassis with other circuit boards.

10. An apparatus comprising:
 an input/output (I/O) support member providing at least first and second I/O faces;
 at least first and second I/O devices supported on the I/O support member such that the first I/O device is accessible via the first I/O face and the second I/O device is accessible via the second I/O face, wherein the first and second I/O devices include at least one connector and at least one visual interface device; and
 at least one user selection member coupled to the I/O support member to position the I/O support member between at least first and second positions enabling access to the first and second I/O faces, respectively.

11. The apparatus of claim 10 wherein the I/O support member includes at least first and second plates forming the first and second I/O faces, respectively.

12. The apparatus of claim 10 wherein the at least a first I/O device includes a plurality of connectors, and wherein the at least a second I/O device includes at least one visual interface device.

13. The apparatus of claim 10 wherein the user selection member includes a thumbwheel coupled to the I/O support member and configured to rotate the I/O support member between the first and second positions.

14. The apparatus of claim 10 further comprising interconnects coupled to the I/O devices and configured to remain coupled to the I/O devices when the I/O support member is positioned between the first and second positions.

15. The apparatus of claim 10 wherein the interconnects include flexible film circuits.

16. An apparatus comprising:
 an input/output (I/O) support member providing at least first and second I/O faces;
 at least first and second I/O devices supported on the I/O support member such that the first I/O device is accessible via the first I/O face and the second I/O device is accessible via the second I/O face; and
 at least one user selection member coupled to the I/O support member to position the I/O support member between at least first and second positions enabling access to the first and second I/O faces, respectively, wherein the user selection member includes a thumbwheel coupled to the I/O support member and configured to rotate the I/O support member between the first and second positions.

17. The apparatus of claim 16, wherein the I/O support member includes at least first and second plates forming the first and second I/O faces, respectively.

18. The apparatus of claim 16, wherein the first and the second I/O device includes at least one connector and at least one visual interface device.

19. The apparatus of claim 16, wherein the at least a first I/O device includes a plurality of connectors, and wherein the at least a second I/O device includes at least one visual interface device.

20. The apparatus of claim 16, further comprising interconnects coupled to the I/O devices and configured to remain coupled to the I/O devices when the I/O support member is positioned between the first and second positions.

21. The apparatus of claim 20, wherein the interconnects include flexible film circuits.

* * * * *